(12) United States Patent
Sole et al.

(10) Patent No.: US 9,654,138 B2
(45) Date of Patent: May 16, 2017

(54) METHODS AND APPARATUS FOR EXPLICIT UPDATES FOR SYMBOL PROBABILITIES OF AN ENTROPY ENCODER OR DECODER

(75) Inventors: Joel Sole, La Jolla, CA (US); Xiaoan Lu, Princeton, NJ (US); Peng Yin, Ithaca, NY (US); Qian Xu, Folsom, CA (US); Yunfei Zheng, San Diego, CA (US)

(73) Assignee: THOMSON LICENSING DTV, Issy-les-Moulineaux (FR)

( * ) Notice: Subject to any disclaimer, the term of this patent is extended or adjusted under 35 U.S.C. 154(b) by 1133 days.

(21) Appl. No.: 13/391,368

(22) PCT Filed: Aug. 13, 2010

(86) PCT No.: PCT/US2010/002246
§ 371 (c)(1),
(2), (4) Date: Feb. 20, 2012

(87) PCT Pub. No.: WO2011/022047
PCT Pub. Date: Feb. 24, 2011

(65) Prior Publication Data
US 2012/0147948 A1    Jun. 14, 2012

Related U.S. Application Data

(60) Provisional application No. 61/235,751, filed on Aug. 21, 2009.

(51) Int. Cl.
*H03M 7/40* (2006.01)
*H04N 19/13* (2014.01)
(Continued)

(52) U.S. Cl.
CPC .......... *H03M 7/4006* (2013.01); *H04N 19/13* (2014.11); *H04N 19/136* (2014.11);
(Continued)

(58) Field of Classification Search
CPC .................................................. H03M 7/4006
See application file for complete search history.

(56) References Cited

U.S. PATENT DOCUMENTS 6,167,160 A * 12/2000 Osawa ............... G06T 9/005
382/238
7,262,721 B2    8/2007 Jeon et al.
(Continued)

FOREIGN PATENT DOCUMENTS

CN    101099391 A    1/2008
CN    101356825 A    1/2009

OTHER PUBLICATIONS

Carpentieri et al., "Lossless Compression of Continuous-Tone Images", Proceedngs of the IEEE, vol. 88, No. 11, Nov. 1, 2000, pp. 1797-1809.
(Continued)

*Primary Examiner* — James Pontius
(74) *Attorney, Agent, or Firm* — Brian J. Dorini; Ronald J. Kolczynski

(57) ABSTRACT

Methods and apparatus are provided for explicit updates for symbol probabilities of an entropy encoder or decoder. An apparatus includes a video encoder having an entropy encoder for encoding symbols for picture data for at least a portion of a picture. An explicit update function is used to update probabilities of the symbols processed by the entropy encoder. The explicit update function at least one of is truncated at a threshold value and has a varying rate of adaptation.

35 Claims, 9 Drawing Sheets

(51) Int. Cl.
- *H04N 19/136* (2014.01)
- *H04N 19/157* (2014.01)
- *H04N 19/42* (2014.01)
- *H04N 19/517* (2014.01)

(52) U.S. Cl.
CPC ........... *H04N 19/157* (2014.11); *H04N 19/42* (2014.11); *H04N 19/517* (2014.11)

(56) References Cited

U.S. PATENT DOCUMENTS

| | | | |
|---|---|---|---|
| 8,446,960 B2 | 5/2013 | Marpe et al. | |
| 2007/0217703 A1* | 9/2007 | Kajiwara | H04N 19/91 382/238 |
| 2012/0147948 A1* | 6/2012 | Sole et al. | 375/240.02 |

OTHER PUBLICATIONS

Ebrahimi et al., "Dynamic Coding of Visual Information", International Organization for Standardization, ISO/IEC JTC1/SC29/WG11 and ITU-T SG16 Q6, No. M0320, Nov. 3, 1995.

Marpe et al., "Context-Based Adaptive Binary Arithmetic Coding in the H.264/AVC Video Compression Standard", IEEE Transactions on Circuits and Systems for Video Technology, vol. 13, No. 7, Jul. 1, 2003, pp. 620-636.

Zhang et al., "Prediction by Partial Approximate Matching for Lossless Image Compression", IEEE Transactions on Image Processing, vol. 17, No. 6, Jun. 2008, pp. 924-935.

Belyaev et al., "Binary Arithmetic Coding System with Adaptive Probability Estimation by 'Virtual Sliding Window'", IEEE Explore, 2006 IEEE.

ITU-T H.264, "Advanced Video Coding for Generic Audiovisual Services", Telecommunication Standardization Sector of ITU, Mar. 2005.

Taubman et al., "JPEG2000 Image Compression Fundamentals, Standards and Practice", Kluwer Academic Publishers, Third Printing, 2004.

Search Report dated: Sep. 23, 2010.

Sullivan, et al., "Text of ISO/IEC 14496-10:200x/PDAM 1 Constrained Baseline Profile and Supplemental Enhancement Information", International Organisation for Standardisation, ISO/IEC JTC1/SC29/WG11, Busan, KR, Oct. 2008.

* cited by examiner

METHODS AND APPARATUS FOR EXPLICIT UPDATES FOR SYMBOL PROBABILITIES OF AN ENTROPY ENCODER OR DECODER

CROSS-REFERENCE TO RELATED APPLICATIONS

This application claims the benefit, under 35 U.S.C. §365 of International Application PCT/US2010/002246, filed Aug. 13, 2010, which was published in accordance with PCT Article 21(2) on Feb. 24, 2011 in English and which claims the benefit of U.S. provisional patent application No. 61/235,751 filed Aug. 21, 2009.

TECHNICAL FIELD

The present principles relate generally to video encoding and decoding and, more particularly, to methods and apparatus for explicit updates for symbol probabilities of an entropy encoder or decoder.

BACKGROUND

Arithmetic coding is used in modern image and video encoders to improve coding efficiency. For example, the International Organization for Standardization/International Electrotechnical Commission (ISO/IEC) Moving Picture Experts Group-4 (MPEG-4) Part 10 Advanced Video Coding (AVC) Standard/International Telecommunication Union, Telecommunication Sector (ITU-T) H.264 Recommendation (hereinafter interchangeably the "MPEG-4 AVC Standard" or "H.264") and the Joint Photographics Experts Group (JPEG) 2000 Standard (hereinafter "JPEG 2000 Standard") employ adaptive binary arithmetic coding in which the probability of a symbol is updated after encoding the symbol. The probability update step makes the coding process adaptive to the video content. These update functions are tabulated in the standards.

Usually, adaptation of the probability of a symbol in a binary arithmetic coder is implemented by means of a look-up table. This can be costly in terms of memory usage. Moreover, the number of probabilities is limited.

An explicit update function solves some of these problems, but has its own limitations. First, a fast and efficient implementation has to be an integer implementation, but in this case, the degree of adaptation is very limited. That is, the adaptation rate is very coarse. Second, the probability can get very close to "0" or "1", which is a problem because if the probability of a symbol is very close to "0" and the symbol appears, then its encoding cost is very high.

The MPEG-4 AVC Standard uses one of the two following entropy codecs depending on the profile: context-adaptive variable length coding (CAVLC); or context-adaptive binary arithmetic coding (CABAC). CABAC is based on arithmetic coding, which allows the assignment of a non-integer number of bits to each symbol of an alphabet, which is extremely beneficial for symbol probabilities that are greater than 0.5. This is not possible in CAVLC. On the other hand, the use of adaptive codes permits the adaptation to non-stationary symbol statistics. Another property of CABAC is the context modeling. The statistics of already coded syntax elements are used to estimate conditional probabilities. These conditional probabilities are used for switching several estimated probability models.

In the MPEG-4 AVC Standard, the arithmetic coding core engine and its associated probability estimation are specified as multiplication-free low-complexity methods using only shifts and table look-ups. The MPEG-4 AVC Standard relies on the assumption that the estimated probabilities of each context model can be represented by a sufficiently limited set of representative values. CABAC uses 64 representative probability values between 0.01875 and 0.5 for the least probable symbol (LPS). The values are derived from the following recursive equation:

$$p_n = \alpha p_{n-1}, \text{ for } n=1, \ldots, 63$$

where $p_0 = 0.5$ and $\alpha = 0.9492$.

As a result of this design, each context model in CABAC is determined by the following two parameters: its current estimate of the LPS probability, which in turn is characterized by an index n between 0 and 63; and its value of the most probable symbol (MPS) being either 0 or 1. Thus, the probability estimation is performed using a total number of 128 states, each of them represented by a 7-bit integer value. A look-up table holds the information of the states and how to jump from one state to another state given the input symbol. Note that the transition update function in the table is an approximation of an exponential function.

In the JPEG 2000 Standard, an adaptive binary arithmetic coder is used. The update function is tabulated. The table has 47 entries divided into two parts. The first 14 entries correspond to the "start-up" portion of the transition table, where few symbols have been observed. The remaining entries represent the non-transient portion of the table. Each entry includes the probability of the LPS to be used by the arithmetic coder, the next entry in the table to jump to in the case that the current symbol is the LPS or the MPS, and a fourth value that holds a 1 if the symbols associated with the LPS and MPS are to be exchanged.

The table in the JPEG 2000 Standard reflects a limited version of a scaled count estimator of the probability. This probability estimation is simply as follows:

$$p = \frac{C_0 + \Delta}{C_0 + C_1 + 2\Delta}$$

where p is the estimated probably, $C_0$ is the count of symbol 0, $C_1$ is the count of symbol 1, and $\Delta$ reflects a conservative policy in which highly skewed distributions are avoided until a large number of outcomes have been observed.

CABAC and JPEG 2000 rely on a finite state machine (FSM) for estimation of the probability of the output of a binary source. Transitions for the finite state machine are defined by a table stored in memory. A disadvantage of this approach includes the frequent referencing to this table (one time for every binary symbol encoding), which is critical for digital signal processing (DSP) implementations. Another disadvantage of this approach is that the tables are small due to memory limitations, so the number of possible probabilities is limited. Moreover, another disadvantage of this approach is that all the symbols have to be encoded with the same function/table, but the statistics and variability of different symbols may be different thus requiring different adaptation rates that a single table cannot offer. There is the option of using more than one table, but each additional table incurs extra complexity and requires additional memory.

A first prior art approach has proposed the use of an explicit probability update function to avoid the use of the table. In further detail, the first prior art approach proposes an adaptation procedure that explicitly uses an exponential update function. The function weights the previous observations with the new symbol as follows:

$$p_n = \alpha p_{n-1} + (1-\alpha) s_n \quad (1)$$

where $s_n$ is the new symbol.

This function is a "sliding window", since the newer observations have more weight than the older ones, thus adapting to the newer statistics. Parameter $\alpha$ is between 0 and 1 and controls the memory of the system. The closer to 0 the value of parameter $\alpha$, the less memory it has, i.e., more weight is given to the newer symbols.

The update in Equation (1) can be efficiently implemented in integer arithmetic. The feasibility of integer arithmetic implementations is quite significant. For example, assume that the probability is (not normalized and is) a number between 0 and $2^{16}-1$, using 16-bit arithmetic. Then, Equation (1) can be implemented as follows:

$$p_n = p_{n-1} - (p_{n-1} - s_n 2^{16}) \gg m \quad (2)$$

where parameter m controls the memory of the system (like parameter $\alpha$ in Equation (1)). The symbol ">>" means a right-shifting of the bits. The bits are right-shifted m positions. This operation is similar to divide by $2^m$.

Parameters m and $\alpha$ play the same role in Equation (1) and Equation (2), respectively. They are the memory rate of the update function, that is, they control the weight given to the past probability estimation and to the current symbols in the probability estimation. The closer to 0 the value of parameter $\alpha$, the less memory the estimation has, i.e., more weight is given to the newer symbols. Similarly, the smaller m is, the more weight is given to the newer symbols, and the larger m is, the more weight is given to the previous estimation (and older symbols). Typically, m has a value from 3 to 7. In this case, $p_n$ indicates the probability of symbol 1 at observation number n. Note that this is arbitrary (a convention used here): $p_n$ could also indicate the probability of symbol 0.

This approach solves some of the problems of the prior art, but has its own limitations. One limitation of the first prior art approach is that the degree of adaptation is very limited by parameter m, which basically accounts for very coarse adaptation factors of the form of powers of 2. Another limitation of the first prior art approach is that the probability can get very close to 0 or 1, which is a problem because if the probability of a symbol is very close to 0 and the symbol appears, then it is very costly to encode the symbol.

SUMMARY

These and other drawbacks and disadvantages of the prior art are addressed by the present principles, which are directed to methods and apparatus for explicit updates for symbol probabilities of an entropy encoder or decoder.

According to an aspect of the present principles, there is provided an apparatus. The apparatus includes a video encoder having an entropy encoder for encoding symbols for picture data for at least a portion of a picture. An explicit update function is used to update probabilities of the symbols processed by the entropy encoder. The explicit update function at least one of is truncated at a threshold value and has a varying rate of adaptation.

According to another aspect of the present principles, there is provided a method in a video encoder having an entropy encoder. The method includes encoding symbols for picture data for at least a portion of a picture. An explicit update function is used to update probabilities of the symbols processed by the entropy encoder. The explicit update function at least one of is truncated at a threshold value and has a varying rate of adaptation.

According to yet another aspect of the present principles, there is provided an apparatus. The apparatus includes a video decoder having an entropy decoder for decoding symbols for picture data for at least a portion of a picture. An explicit update function is used to update probabilities of the symbols processed by the entropy decoder. The explicit update function at least one of is truncated at a threshold value and has a varying rate of adaptation.

According to a further aspect of the present principles, there is provided a method in a video decoder having an entropy decoder. The method includes decoding symbols for picture data for at least a portion of a picture. An explicit update function is used to update probabilities of the symbols processed by the entropy decoder. The explicit update function at least one of is truncated at a threshold value and has a varying rate of adaptation.

These and other aspects, features and advantages of the present principles will become apparent from the following detailed description of exemplary embodiments, which is to be read in connection with the accompanying drawings.

BRIEF DESCRIPTION OF THE DRAWINGS

The present principles may be better understood in accordance with the following exemplary figures, in which.

DETAILED DESCRIPTION

Figure 1:
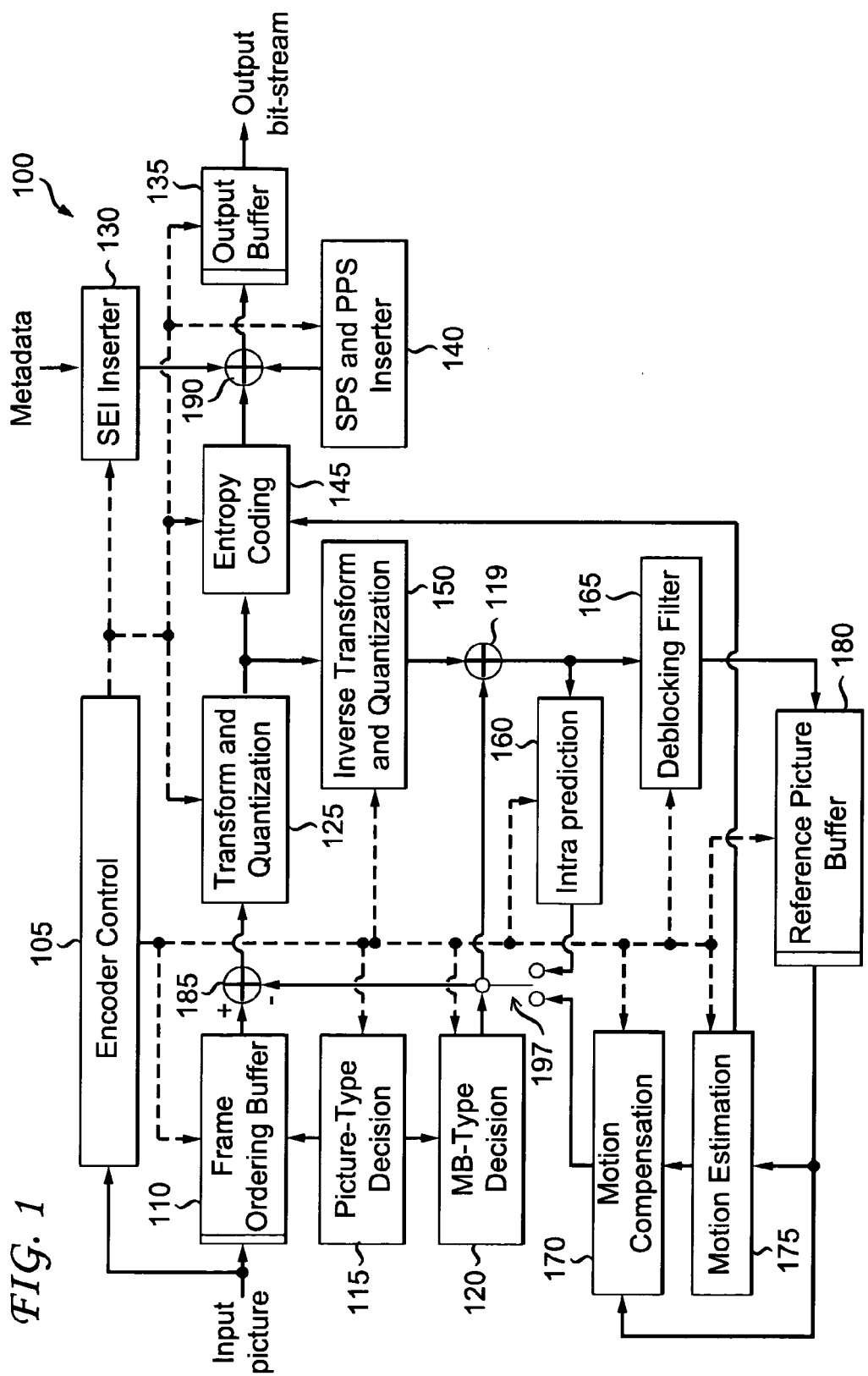
FIG. 1 is a block diagram showing an exemplary video encoder to which the present principles may be applied, in accordance with an embodiment of the present principles.

The present principles are directed to methods and apparatus for explicit updates for symbol probabilities of an entropy encoder or decoder.

The present description illustrates the present principles. It will thus be appreciated that those skilled in the art will be able to devise various arrangements that, although not explicitly described or shown herein, embody the present principles and are included within its spirit and scope.

All examples and conditional language recited herein are intended for pedagogical purposes to aid the reader in understanding the present principles and the concepts contributed by the inventor(s) to furthering the art, and are to be construed as being without limitation to such specifically recited examples and conditions.

Moreover, all statements herein reciting principles, aspects, and embodiments of the present principles, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the present principles. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read-only memory ("ROM") for storing software, random access memory ("RAM"), and non-volatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The present principles as defined by such claims reside in the fact that the functionalities provided by the various recited means are combined and brought together in the manner which the claims call for. It is thus regarded that any means that can provide those functionalities are equivalent to those shown herein.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Moreover, it is to be appreciated that while one or more embodiments of the present principles are described herein with respect to the MPEG-4 AVC Standard, the present principles are not limited to solely this standard and, thus, may be utilized with respect to other video or image coding standards, recommendations, and extensions thereof, including extensions of the MPEG-4 AVC standard, while maintaining the spirit of the present principles.

Also, as used herein, the words "picture" and "image" are used interchangeably and refer to a still image or a picture from a video sequence. As is known, a picture may be a frame or a field.

Additionally, as used herein, the phrase "extreme probability values" refers to 0 and 1 when probabilities are normalized, or the corresponding non-normalized values of 0 and 1. For example, if 8 bits are used to indicate a non-normalized probability, then the extreme values are 0 and 255.

Turning to FIG. 1, an exemplary video encoder to which the present principles may be applied is indicated generally by the reference numeral 100. The video encoder 100 includes a frame ordering buffer 110 having an output in signal communication with a non-inverting input of a combiner 185. An output of the combiner 185 is connected in signal communication with a first input of a transformer and quantizer 125. An output of the transformer and quantizer 125 is connected in signal communication with a first input of an entropy coder 145 and a first input of an inverse transformer and inverse quantizer 150. An output of the entropy coder 145 is connected in signal communication with a first non-inverting input of a combiner 190. An output of the combiner 190 is connected in signal communication with a first input of an output buffer 135.

A first output of an encoder controller 105 is connected in signal communication with a second input of the frame ordering buffer 110, a second input of the inverse transformer and inverse quantizer 150, an input of a picture-type decision module 115, a first input of a macroblock-type (MB-type) decision module 120, a second input of an intra prediction module 160, a second input of a deblocking filter 165, a first input of a motion compensator 170, a first input of a motion estimator 175, and a second input of a reference picture buffer 180.

A second output of the encoder controller 105 is connected in signal communication with a first input of a Supplemental Enhancement Information (SEI) inserter 130, a second input of the transformer and quantizer 125, a second input of the entropy coder 145, a second input of the output buffer 135, and an input of the Sequence Parameter Set (SPS) and Picture Parameter Set (PPS) inserter 140.

An output of the SEI inserter 130 is connected in signal communication with a second non-inverting input of the combiner 190.

A first output of the picture-type decision module 115 is connected in signal communication with a third input of the frame ordering buffer 110. A second output of the picture-type decision module 115 is connected in signal communication with a second input of a macroblock-type decision module 120.

An output of the Sequence Parameter Set (SPS) and Picture Parameter Set (PPS) inserter 140 is connected in signal communication with a third non-inverting input of the combiner 190.

An output of the inverse quantizer and inverse transformer 150 is connected in signal communication with a first non-inverting input of a combiner 119. An output of the combiner 119 is connected in signal communication with a first input of the intra prediction module 160 and a first input of the deblocking filter 165. An output of the deblocking filter 165 is connected in signal communication with a first input of a reference picture buffer 180. An output of the reference picture buffer 180 is connected in signal communication with a second input of the motion estimator 175 and a third input of the motion compensator 170. A first output of the motion estimator 175 is connected in signal communication with a second input of the motion compensator 170. A second output of the motion estimator 175 is connected in signal communication with a third input of the entropy coder 145.

An output of the motion compensator 170 is connected in signal communication with a first input of a switch 197. An output of the intra prediction module 160 is connected in signal communication with a second input of the switch 197. An output of the macroblock-type decision module 120 is connected in signal communication with a third input of the switch 197. The third input of the switch 197 determines whether or not the "data" input of the switch (as compared to the control input, i.e., the third input) is to be provided by the motion compensator 170 or the intra prediction module 160. The output of the switch 197 is connected in signal communication with a second non-inverting input of the combiner 119 and an inverting input of the combiner 185.

A first input of the frame ordering buffer 110 and an input of the encoder controller 105 are available as inputs of the encoder 100, for receiving an input picture. Moreover, a second input of the Supplemental Enhancement Information (SEI) inserter 130 is available as an input of the encoder 100, for receiving metadata. An output of the output buffer 135 is available as an output of the encoder 100, for outputting a bitstream.

Figure 2:
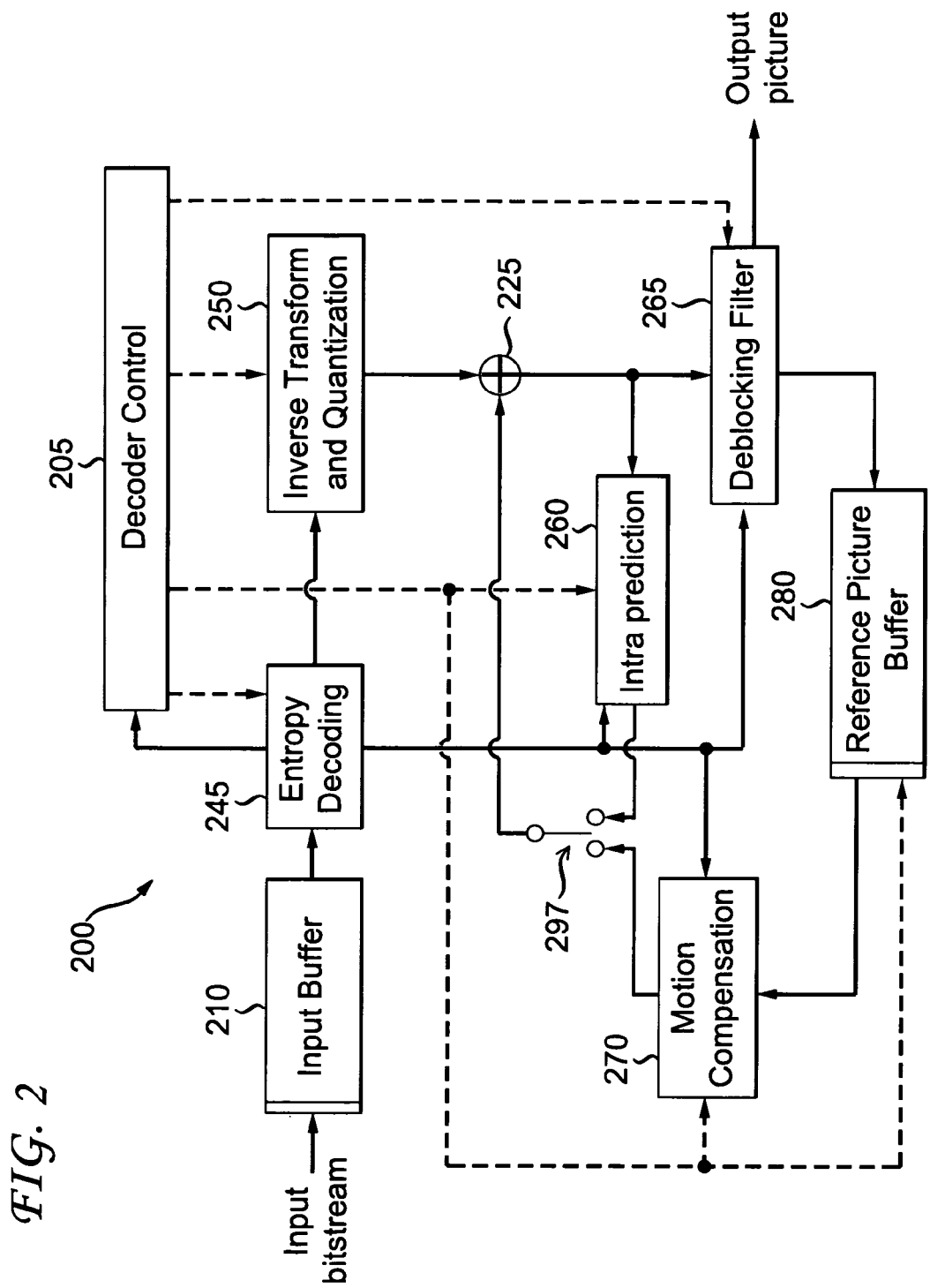
FIG. 2 is a block diagram showing an exemplary video decoder to which the present principles may be applied, in accordance with an embodiment of the present principles.

Turning to FIG. 2, an exemplary video decoder to which the present principles may be applied is indicated generally by the reference numeral 200. The video decoder 200 includes an input buffer 210 having an output connected in signal communication with a first input of an entropy decoder 245. A first output of the entropy decoder 245 is connected in signal communication with a first input of an inverse transformer and inverse quantizer 250. An output of the inverse transformer and inverse quantizer 250 is connected in signal communication with a second non-inverting input of a combiner 225. An output of the combiner 225 is connected in signal communication with a second input of a deblocking filter 265 and a first input of an intra prediction module 260. A second output of the deblocking filter 265 is connected in signal communication with a first input of a reference picture buffer 280. An output of the reference picture buffer 280 is connected in signal communication with a second input of a motion compensator 270.

A second output of the entropy decoder 245 is connected in signal communication with a third input of the motion compensator 270, a first input of the deblocking filter 265, and a third input of the intra predictor 260. A third output of the entropy decoder 245 is connected in signal communication with an input of a decoder controller 205. A first output of the decoder controller 205 is connected in signal communication with a second input of the entropy decoder 245. A second output of the decoder controller 205 is connected in signal communication with a second input of the inverse transformer and inverse quantizer 250. A third output of the decoder controller 205 is connected in signal communication with a third input of the deblocking filter 265. A fourth output of the decoder controller 205 is connected in signal communication with a second input of the intra prediction module 260, a first input of the motion compensator 270, and a second input of the reference picture buffer 280.

An output of the motion compensator 270 is connected in signal communication with a first input of a switch 297. An output of the intra prediction module 260 is connected in signal communication with a second input of the switch 297. An output of the switch 297 is connected in signal communication with a first non-inverting input of the combiner 225.

An input of the input buffer 210 is available as an input of the decoder 200, for receiving an input bitstream. A first output of the deblocking filter 265 is available as an output of the decoder 200, for outputting an output picture.

As noted above, the present principles are directed to methods and apparatus for explicit updates for symbol probabilities of an entropy encoder or decoder.

At least one embodiment involves a novel use of explicit update functions, in which the explicit update functions have varying rates of adaptation and/or are truncated at one or more threshold values in order to improve the coding efficiency. These new probability update functions have the following advantages, thus avoiding the aforementioned problems of the prior art: (1) avoids the use of look-up tables; (2) avoids the problems relating to efficiency for probabilities too close to 0 or 1; and (3) reaches a finer rate of adaptation. Moreover, integer arithmetic versions of various implementations of the present principles advantageously are efficient, computationally simple, and also avoid the aforementioned problems of the prior art.

In the MPEG-4 AVC Standard, the arithmetic coder probability update is performed by a look-up table that indicates the next state/probability given the current one and the input symbol. Advantageously and in accordance with the present principles, the use of look-up tables is avoided by using an explicit function. One of these functions can be the exponential function, which can be in the form of Equation (1).

Figure 3:
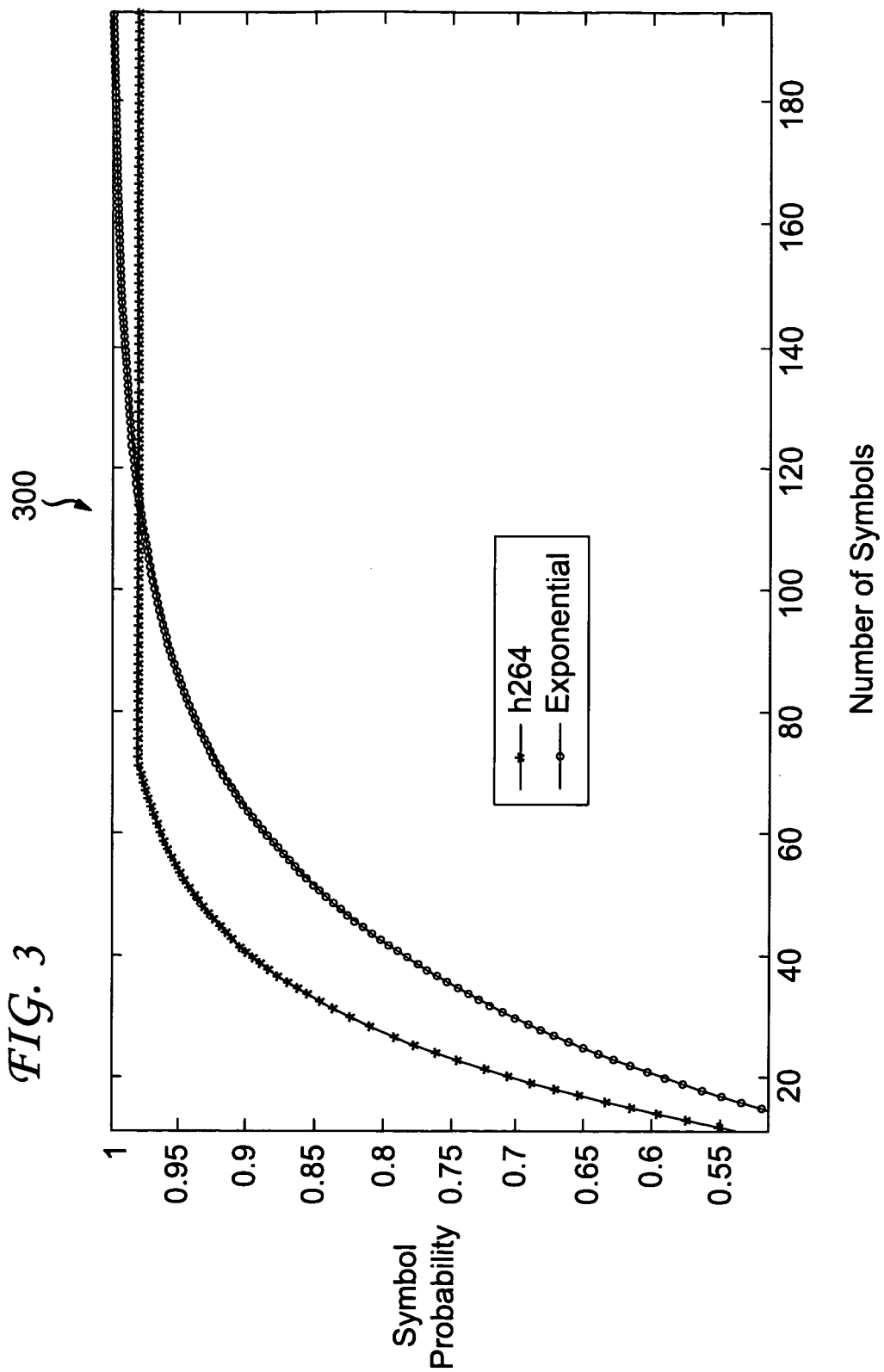
FIG. 3 is a diagram showing an exemplary plot of symbol probability versus number of symbols, in accordance with an embodiment of the present principles.

Turning to FIG. 3, an exemplary plot of symbol probability versus number of symbols is indicated generally by the reference numeral 300. The X axis of the plot 300 pertains to the number of symbols encoded or decoded, and the Y axis of the plot 300 pertains to the symbol probability (normalized to 1). The plot 300 includes, for a same input bit, a curve (designated as "h264" in FIG. 3) for the MPEG-4

AVC Standard probability update function, and a curve (designated as "Exponential" in FIG. 3) for the exponential probability update function in Equation (2). The plot 300 can be considered to show the evolution of the probability of a symbol given that the input is that symbol all the time. Moreover, the plot 300 shows the evolution of the MPEG-4 AVC Standard (H.264) update and the exponential (in Equation (2)). As can be observed, the exponential function gets very close to the probability equaling 1, which can be a problem if the opposite bit appears and it is to be encoded. This problem does not appear in the MPEG-4 AVC Standard, where the probability saturates at some point close to 1. The reason is that the table is finite and there is a maximum value the table can attain.

Figure 4:
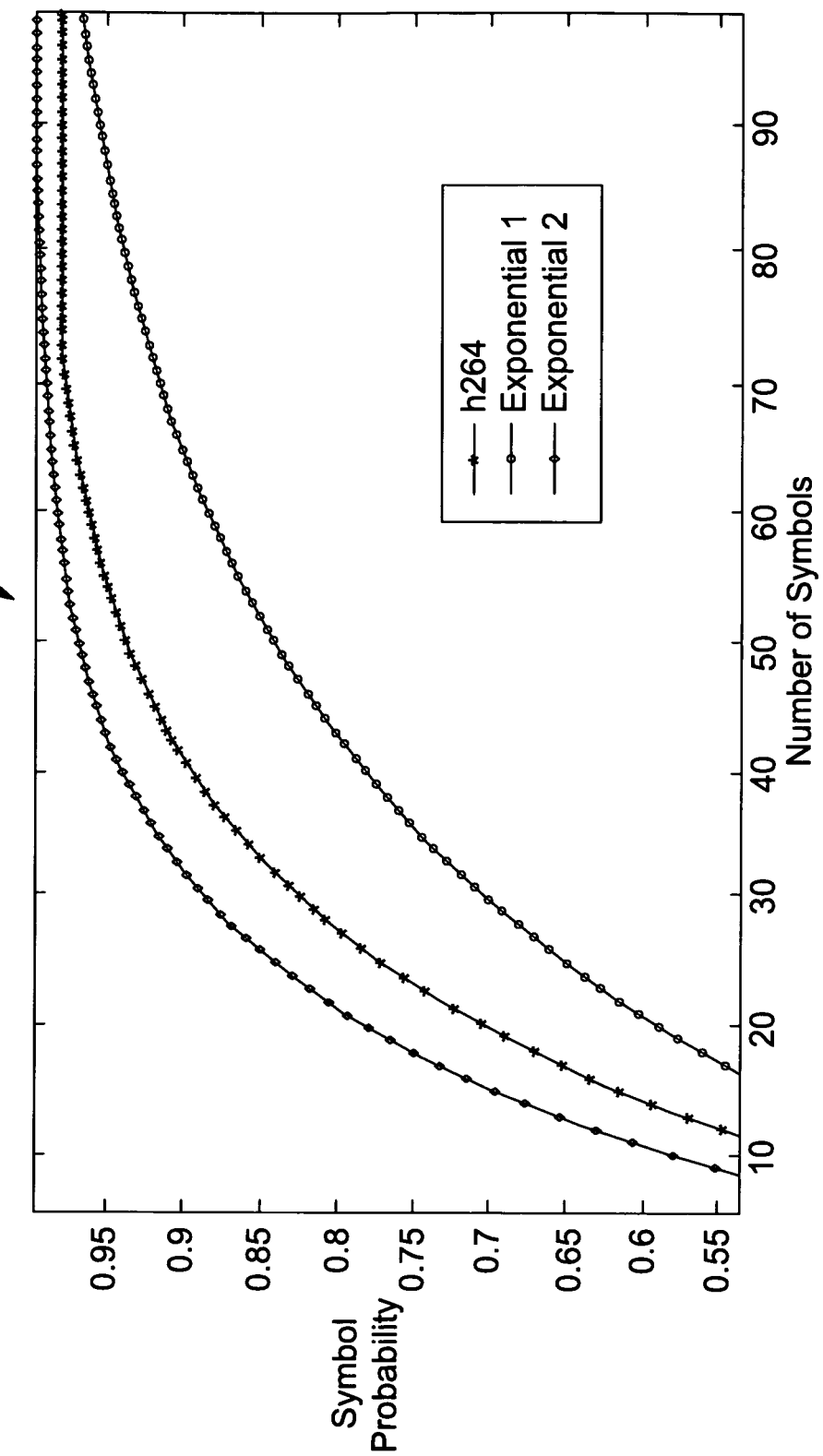
FIG. 4 is a diagram showing another exemplary plot of symbol probability versus number of symbols, in accordance with an embodiment of the present principles.

Another problem is the rate of adaptation of the exponential. Turning to FIG. 4, another exemplary plot of symbol probability versus number of symbols is indicated generally by the reference numeral 400. The X axis of the plot 400 pertains to the number of symbols, and the Y axis of the plot 400 pertains to the symbol probability. The plot 400 includes, for a same input bit, a curve (designated as "h264" in FIG. 4) for the MPEG-4 AVC Standard probability update function, a curve (designated as "Exponential 1" in FIG. 4) for a first exponential probability update function, and a curve (designated as "Exponential 2" in FIG. 4) for a second exponential probability update function. Regarding the integer arithmetic approach (Equation (2)), the memory factor can only be powers of 2, so the rate tuning is coarse. For example, plot 400 shows the exponential with a memory rate (m in Equation (2)) of 4 and 5. The H.264 (MPEG-4 AVC Standard) curve is between the two exponential curves. Since m is an integer, the exponential cannot get any closer to the H.264 (MPEG-4 AVC Standard) curve. It can be beneficial to choose the memory rate in a finer (less coarse) manner. As used herein, variable "m" refers to the memory rate.

In one embodiment of the present principles, we propose the use of an explicit update function(s) (so that no table is required) that has at least one of the following characteristics: (1) avoids probabilities too close to 0 or 1; and (2) reaches a finer rate of adaptation.

Additionally, we propose solutions that can be implemented in integer arithmetic.

Figure 5:
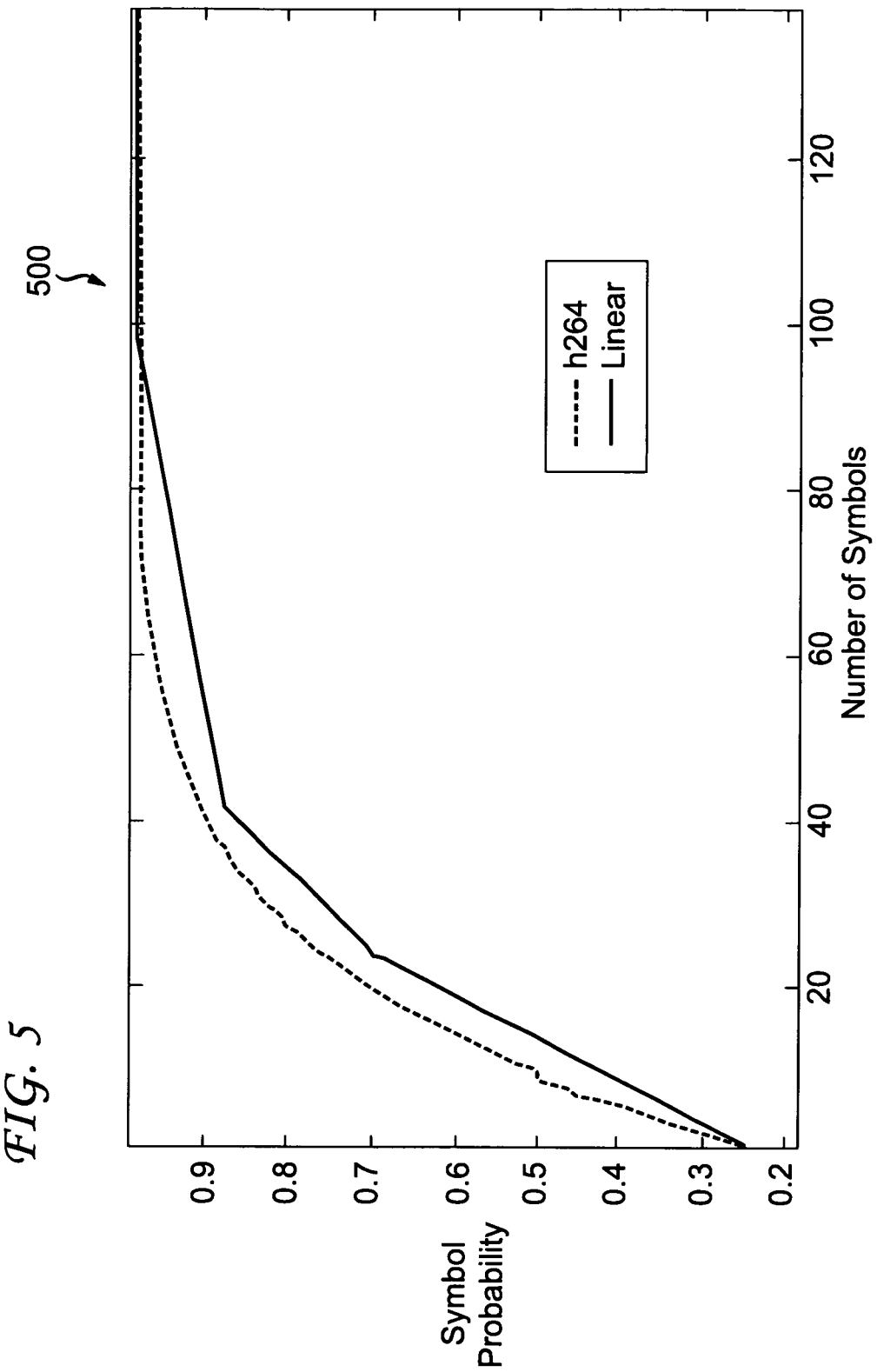
FIG. 5 is a diagram showing yet another exemplary plot of symbol probability versus number of symbols, in accordance with an embodiment of the present principles.

In one embodiment, we propose the use of a linear function by parts. The function is linear and has different slopes in different parts of the function, and two thresholds, one at the bottom and another at the top in order to avoid getting too close to extreme probabilities. Turning to FIG. 5, yet another exemplary plot of symbol probability versus number of symbols is indicated generally by the reference numeral 500. The X axis of the plot 500 pertains to the number of symbols, and the Y axis of the plot 500 pertains to the symbol probability. The plot 500 includes, for a same input bit, a curve (designated as "h264" in FIG. 5) for the MPEG-4 AVC Standard probability update function, and a curve (designated as "Linear" in FIG. 5) for a linear probability update function by parts. The slope can be easily adjusted in integer arithmetic in order to have the desired rate of adaptation in each part. In addition, different syntax elements can have different slopes, thus taking into account their specific characteristics.

Note that the probability in FIG. 5 is normalized to 1. In 16-bit integer arithmetic, the probability is in the range [0-65355]. The given example uses the following thresholds and slopes:

Pone=65356 (non-normalized maximum probability: usually probability is from 0 to 1, in this case, probability 1 is not normalized and equals 65536)
Threshold_t1=45056
Threshold_t2=57344
Threshold_t3=64512
Slope_s1=1280
Slope_s2=640
Slope_s3=128

In another embodiment, we use an exponential function with two thresholds (i.e., truncated or threshold exponentials), one at the bottom and the other at the top in order to avoid getting too close to extreme probabilities.

In another embodiment, we use an exponential function setting the limit of the exponentials to be different from 0 and 1. In this way, asymptotically the value is not too close to 0 or 1. The update function is similar to the one in Equation (1), with some modifications:

$$p_n = \alpha p_{n-1} + (1-\alpha)\tilde{s}_n$$

where mapping the value of the symbol $s_n$ (which is 0 or 1) to a value $\tilde{s}_n$ close to it, we have the following value $$\tilde{s}_n = \begin{cases} 1-\delta & \text{if } s_n = 1 \\ \delta & \text{if } s_n = 0 \end{cases},$$

so that the limit or extreme values are different from 0 or 1. The convergence of the function is not to 0 or 1 anymore, but to $\delta$ and $1-\delta$, respectively. It is to be appreciated that the symbol $\delta$ is interchangeably referred to herein as "delta". Typically, the value of $\delta$ is very small. For example, $\delta=0.001$ shows good performance. The range of values for delta is 0 to 1 for this embodiment. Values giving good results range from 0 to 0.05, but the optimal values depend on the statistics of the probability to estimate. By this change, we assure that the probability is not excessively skewed.

In another embodiment, we use an exponential function with two thresholds (i.e., truncated or threshold exponentials), one at the bottom and the other at the top in order to avoid getting too close to extreme probabilities, and setting the limits of the exponential to be different from 0 or 1. In this case, since a threshold is applied, the values of delta can be negative in some ranges, thus having a finer tuning of the convergence.

In another embodiment, we implement the previous function in integer arithmetic. Assume that $p_n$ indicates the probability of symbol 0 at observation number n. Then, if the symbol is 0, the following update can be used:

$$p_n = p_{n-1} - (p_{n-1} - (2^{16} - \delta)) \gg m \quad (3)$$

If the symbol is 1, then the following update can be used:

$$p_n = p_{n-1} - (p_{n-1} - \delta) \gg m \quad (4)$$

It is to be appreciated, as mentioned above, that the convention for $p_n$ indicating the probability of symbol 0 is arbitrary and, thus, in another embodiment, $p_n$ could indicate the probability of symbol 1.

In this situation, the value of $\delta$ is also small. This "small" value (of $\delta$) is compared to the range of the non-normalized probability, i.e., in the previous case $\delta=0.001$ was the suggested value and it is small compared to the maximum normalized probability which is 1. In integer arithmetic, the maximum probability is determined by the number of bits used to represent the probability. If the number of bits is 16, then the maximum probability is 65536, and the value of $\delta$ (now an integer number) is small or large compared to this maximum probability. Assuming the previously stated 16-bit arithmetic and with m=5, then a reasonable range for δ is from 16 to 2048. Note that in this case delta takes on integer values. A value of 256 gives very good results in our experiments, but the optimal value depends on the statistics of the symbol probability, and also if it is stationary or not. A value 452 is found to be theoretically optimal in common stationary situations.

Figure 6:
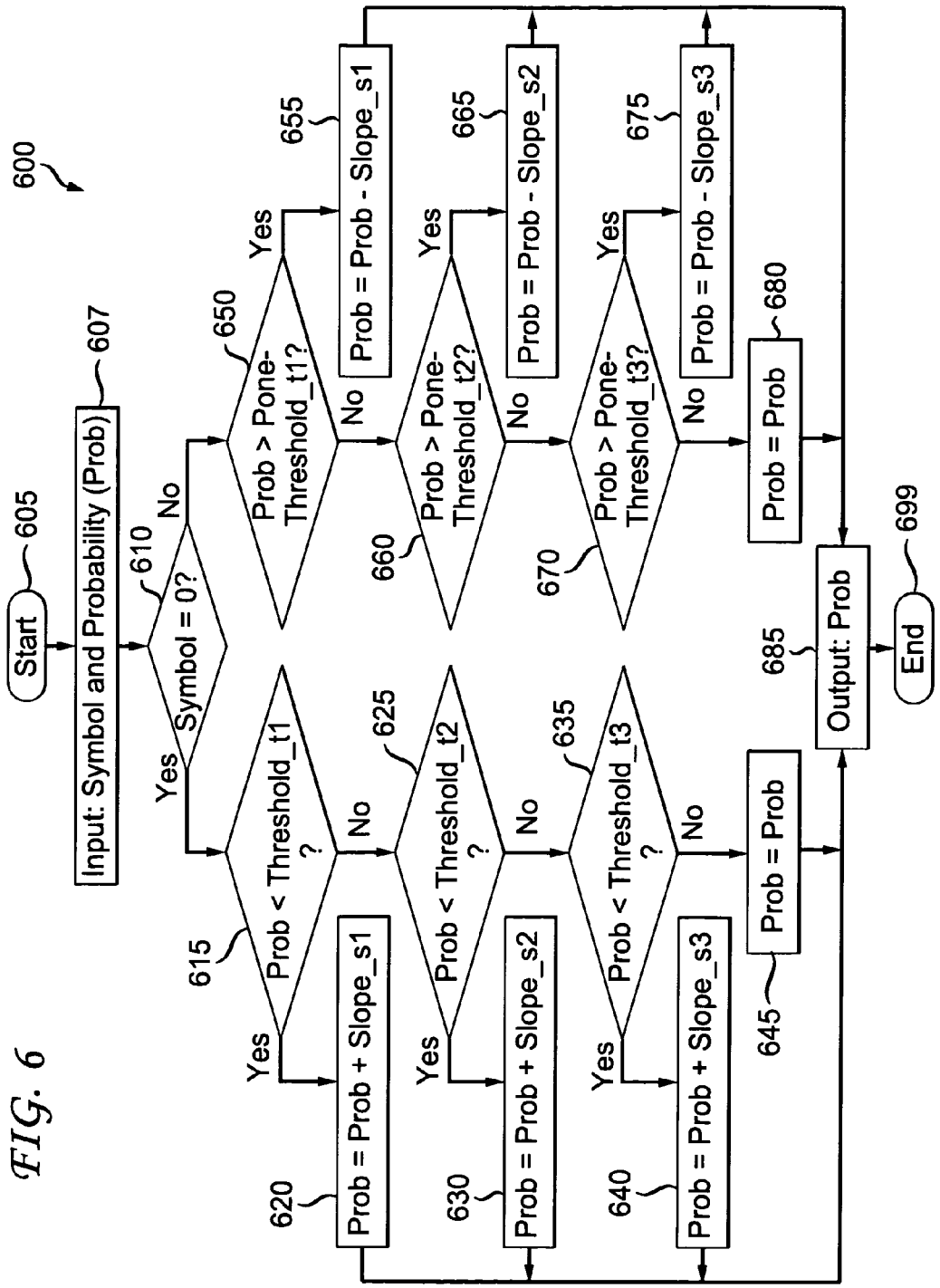
FIG. 6 is a flow diagram showing an exemplary method for performing a probability update function as a linear by parts function with thresholds, in accordance with an embodiment of the present principles.

Turning to FIG. 6, an exemplary method for performing a probability update function as a linear by parts function with thresholds is indicated generally by the reference numeral 600. The method 600 includes a start block 605 that passes control to a function block 607. The function block 607 inputs a symbol and a probability (also interchangeably referred to as "Prob") corresponding thereto, and passes control to a decision block 610. The decision block 610 determines whether or not the symbol is equal to 0. If so, then control is passed to a decision block 615. Otherwise, control is passed to a decision block 650. The decision block 615 determines whether or not Prob<Threshold_t1. If so, then control is passed to a function block 620. Otherwise, control is passed to a decision block 625. The function block 620 sets Prob=Prob+Slope_s1, and passes control to a function block 685. The decision block 625 determines whether or not Prob<Threshold_t2. If so, then control is passed to a function block 630. Otherwise, control is passed to a decision block 635. The function block 630 sets Prob=Prob+Slope_s2, and passes control to the function block 685. The decision block 635 determines whether or not Prob<Threshold_t3. If so, then control is passed to a function block 640. Otherwise, control is passed to a function block 645. The function block 640 sets Prob=Prob+Slope_s3, and passes control to the function block 685. The function block 645 sets Prob=Prob, and passes control to the function block 685. The decision block 650 determines whether or not Prob>Pone−Threshold_t1. If so, then control is passed to a function block 655. Otherwise, control is passed to a decision block 660. The function block 655 sets Prob=Prob−Slope_s1, and passes control to the function block 685. The decision block 660 determines whether or not Prob>Pone−Threshold_t2. Pone is the maximum probability, i.e., the non-normalized value of the normalized probability of 1. If so, then control is passed to a function block 665. Otherwise, control is passed to a decision block 670. The function block 665 sets Prob=Prob−slope_s2, and passes control to the function block 685. The decision block 670 determines whether or not Prob>Pone−Threshold_t3. If so, then control is passed to a function block 675. Otherwise, control is passed to a function block 680. The function block 675 sets Prob=Prob−Slope_S3, and passes control to the function block 685. The function block 680 sets Prob=Prob, and passes control to the function block 685. The function block 685 outputs the probability (Prob), and passes control to an end block 699.

Figure 7:
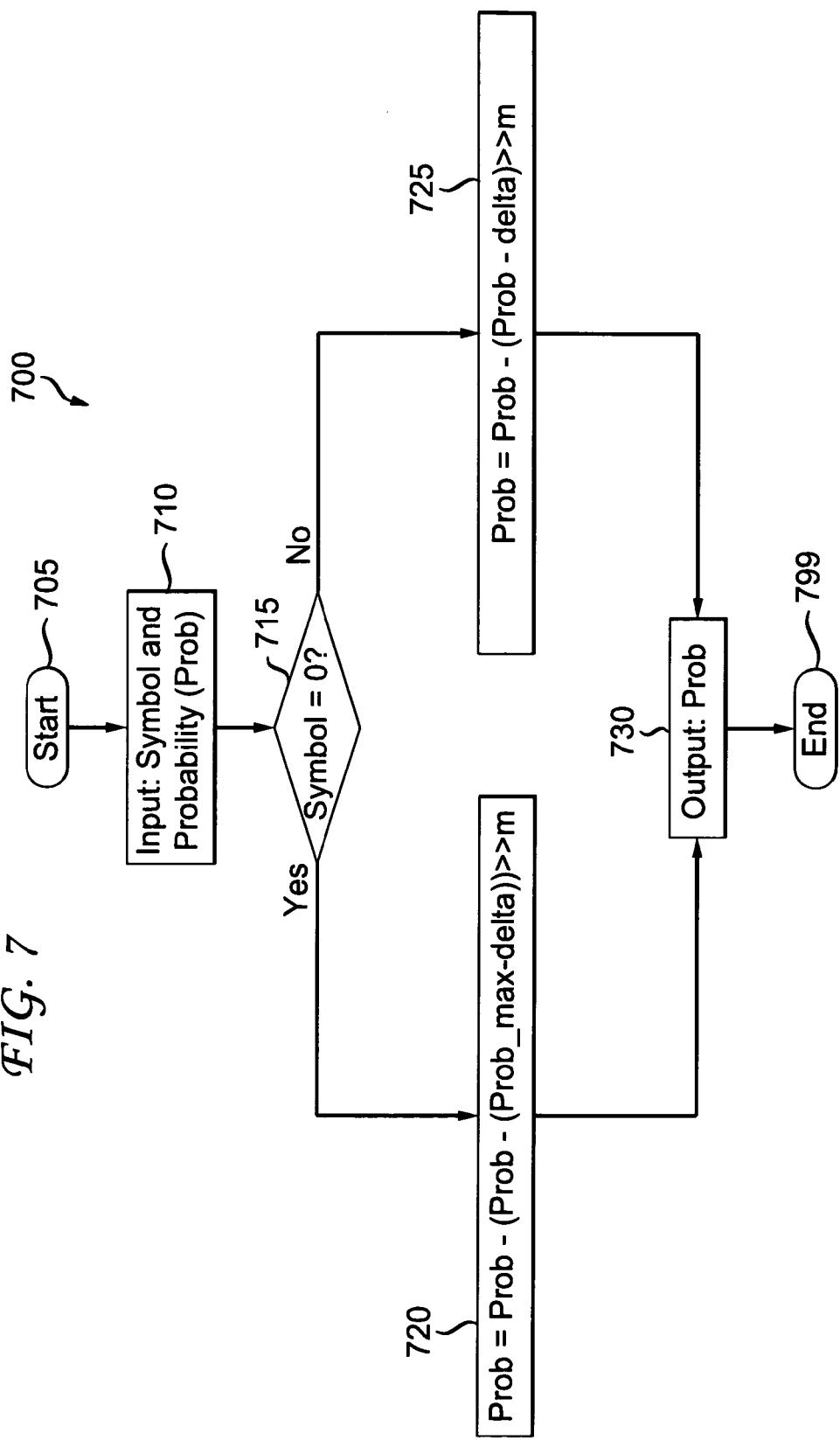
FIG. 7 is a flow diagram showing an exemplary method for performing a probability update with an integer arithmetic exponential function with limits determined by a variable delta, in accordance with an embodiment of the present principles.

Turning to FIG. 7, an exemplary method for performing a probability update with an integer arithmetic exponential function with limits determined by a variable delta is indicated generally by the reference numeral 700. The method 700 includes a start block 705 that passes control to a function block 710. The function block 710 inputs a symbol and a probability corresponding thereto, and passes control to a decision block 715. The decision block 715 determines whether or not Symbol=0. If so, then control is passed to a function block 720. Otherwise, control is passed to a function block 725. The function block 720 sets Prob=Prob−(Prob−(Prob_max−delta))>>m, and passes control to a function block 730. The function block 730 outputs the probability (Prob), and passes control to an end block 799. The function block 725 sets Prob=Prob−(Prob−delta)>>m, and passes control to the function block 730.

Figure 8:
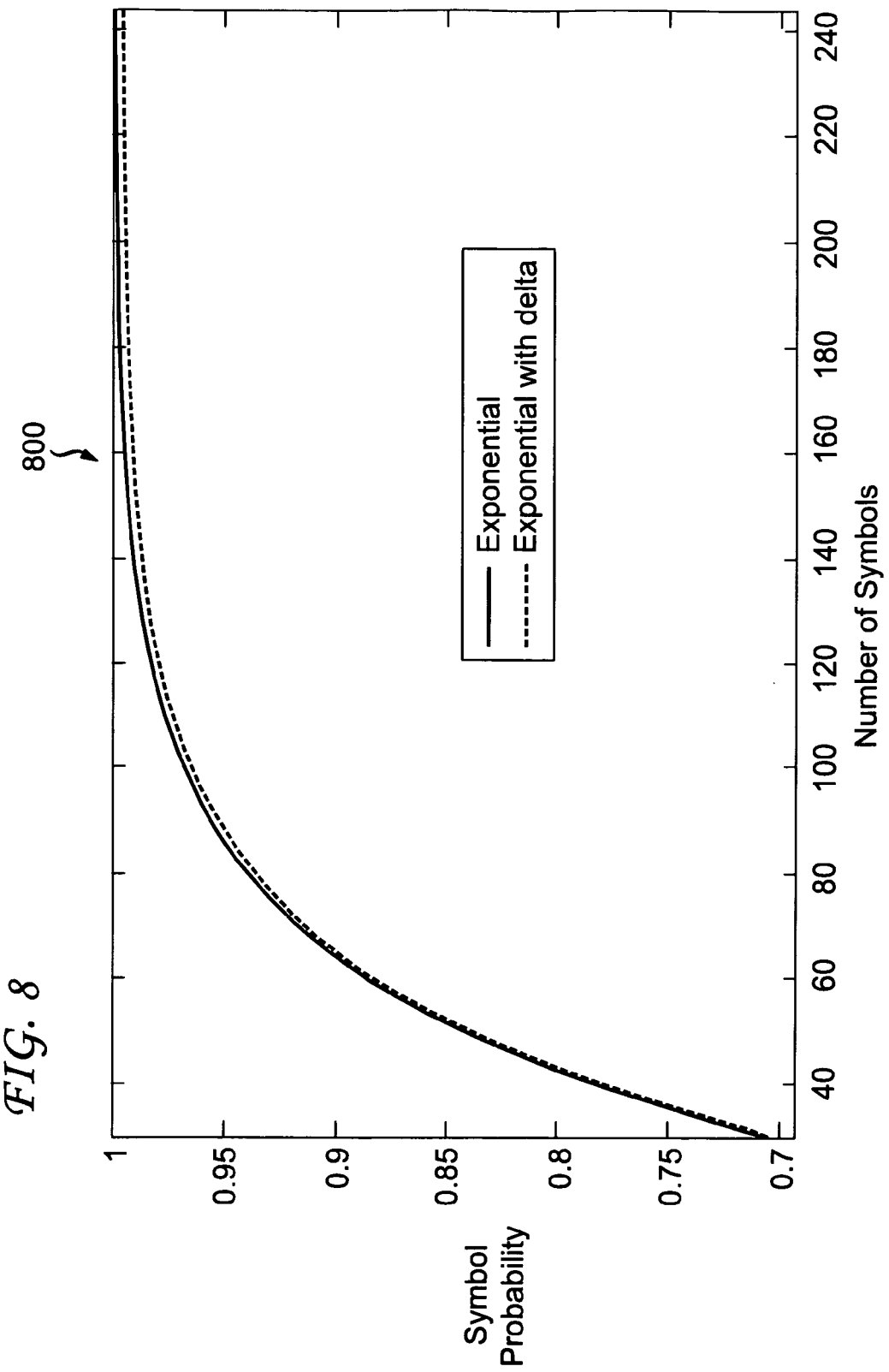
FIG. 8 is a diagram showing still another exemplary plot of symbol probability versus number of symbols, in accordance with an embodiment of the present principles.

Turning to FIG. 8, still another exemplary plot of symbol probability versus number of symbols is indicated generally by the reference numeral 800. The x axis of the plot 800 pertains to the number of symbols, and the Y axis of the plot 800 pertains to the symbol probability. The plot includes, for a same input bit, a curve (designated as "exponential" in FIG. 8) for an integer arithmetic exponential function that does not use δ to set limits, and a curve (designated as "exponential with delta" in FIG. 8) for an integer arithmetic exponential function that uses δ to set limits. FIG. 8 corresponds to an example comparing the embodiment of FIG. 7 with the case of not setting limits with δ. It should be noted how the rate and the limits of the function are different.

Moreover, note that δ also regulates the rate of adaptation. A larger δ implies a lower rate. When δ is 0 we have the adaptation rate determined by parameter m. When δ goes below 0, then the adaptation rate is faster. This observation leads to the following embodiment.

In this embodiment, we use a function exponential by parts, in which thresholds determine different parts of the function with different values for the parameters. Each part can have a different value for δ and for m. These two parameters can then regulate the right rate for each part in a fine way. Additionally, different contexts can have different values as well.

In another embodiment, we combine exponential function and linear functions by parts.

Figure 9:
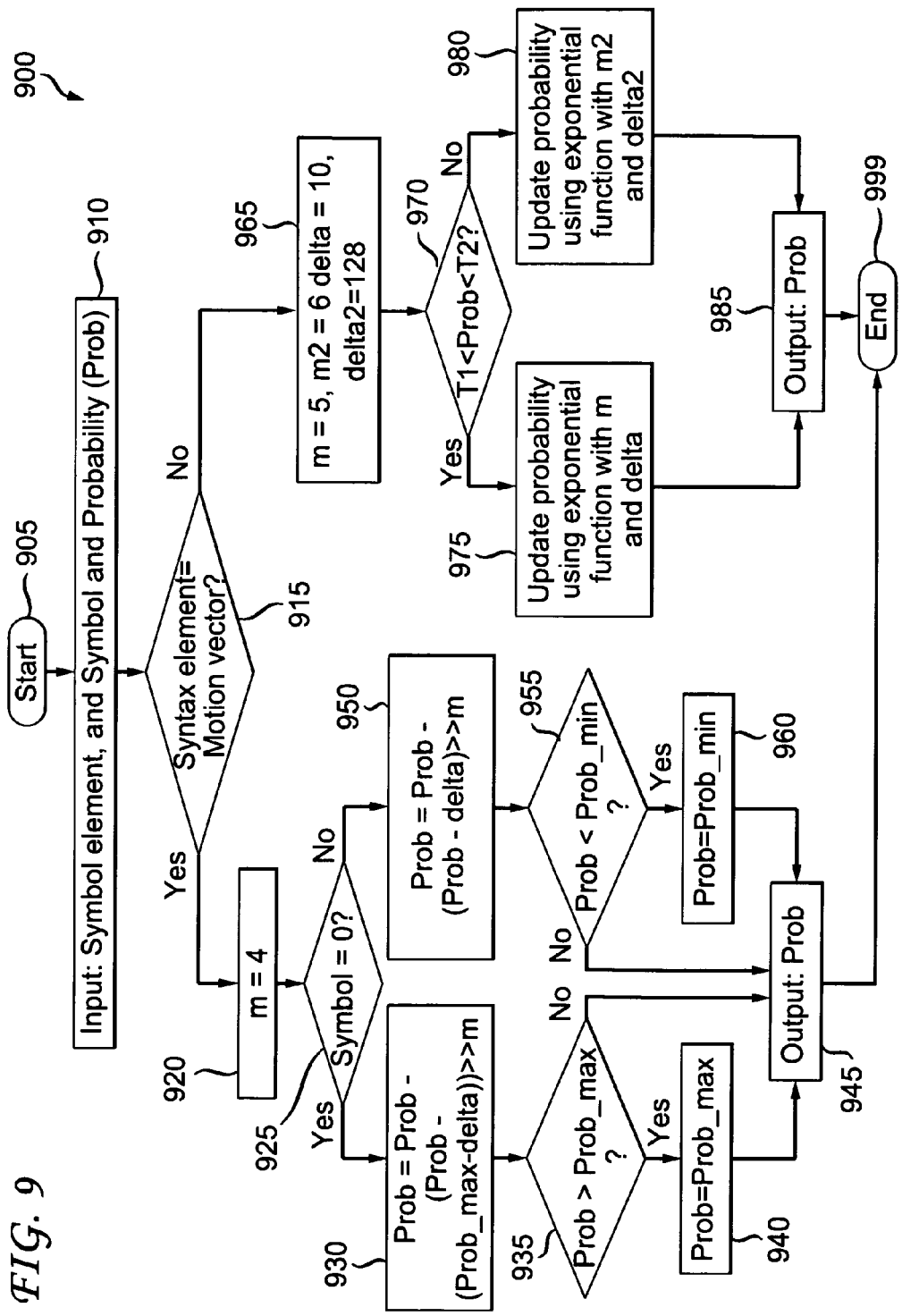
FIG. 9 is a flow diagram showing an exemplary method for performing a probability update with integer arithmetic exponential functions in which the function parameters depend on the syntax element to encode and the current probability of the symbol, in accordance with an embodiment of the present principles.

Turning to FIG. 9, an exemplary method for performing a probability update with integer arithmetic exponential functions in which the function parameters depend on the syntax element to encode and the current probability of the symbol is indicated generally by the reference numeral 900. The method 900 includes a start block 905 that passes control to a function block 910. The function block 910 inputs a syntax element, a symbol, and a probability (Prob), and passes control to a decision block 915. The decision block 915 determines whether or not (a value of) the syntax element is equal to (a value of) a motion vector. If so, then control is passed to a function block 920. Otherwise, control is passed to a function block 965. The function block 920 sets (a variable) m=4, and passes control to a decision block 925. The decision block 925 determines whether or not the value of the symbol is equal to 0. If so, then control is passed to a function block 930. Otherwise, control is passed to a function block 950. The function block 930 sets Prob=Prob−(Prob−(Prob_max−delta))>>m, and passes control to a decision block 935. The decision block 935 determines whether or not Prob>Prob_max. If so, then control is passed to a function block 940. Otherwise, control is passed to a function block 945. The function block 940 sets Prob=Prob_max, and passes control to the function block 945. The function block 945 outputs the probability Prob, and passes control to an end block 999.

The function block 950 sets Prob=Prob−(Prob−delta)>>m, and passes control to a decision block 955. The decision block 955 determines whether or not Prob<Prob_min. If so, then control is passed to a function block 960. Otherwise, control is passed to the function block 945. The function block 960 sets Prob=Prob_min, and passes control to the function block 945.

The function block 965 sets m=5, m2=6, delta=10, delta2=128, where m, m2, delta, and delta2 are variables, and passes control to a decision block 970. The decision block 970 determines whether or not T1<Prob<T2, where T1 is a lower threshold and T2 is an upper threshold. If so, then control is passed to a function block 975. Otherwise, control is passed to a function block 980. The function block 975 updates the probability Prob using an exponential function with m and delta, and passes control to a function block 985. The function block 985 outputs the probability Prob, and passes control to an end block 999. The function block 980 updates the probability Prob using an exponential function with m2 and delta2, and passes control to the function block 985.

A description will now be given of some of the many attendant advantages/features of the present invention, some of which have been mentioned above. For example, one advantage/feature is an apparatus having a video encoder. The video encoder has an entropy encoder for encoding symbols for picture data for at least a portion of a picture. An explicit update function is used to update probabilities of the symbols processed by the entropy encoder. The explicit update function at least one of is truncated at a threshold value and has a varying rate of adaptation.

Another advantage/feature is the apparatus having the encoder as described above, wherein the explicit update function is truncated with respect to probability values at least one of greater than an upper threshold limit and less than a lower threshold limit.

Still another advantage/feature is the apparatus having the encoder as described above, wherein the explicit update function is a linear by parts function with thresholds.

Yet another advantage/feature is the apparatus having the encoder as described above, wherein the explicit update function is an exponential function with thresholds.

A further advantage/feature is the apparatus having the encoder as described above, wherein the explicit update function is an exponential function with asymptotic limits different from at least one of an upper probability limit value and a lower probability limit value.

Moreover, another advantage/feature is the apparatus having the encoder wherein the explicit update function is an exponential function with asymptotic limits different from at least one of an upper probability limit value and a lower probability limit value as described above, wherein the explicit update function uses integer arithmetic.

Further, another advantage/feature is the apparatus having the encoder wherein the explicit update function uses integer arithmetic as described above, wherein the symbols are binary symbols, and $P_n$ is capable of indicating a probability of a particular one of the symbols having a value of 0 or a value of 1 at observation number n, and:

if the probability $P_n$ indicates the probability of the particular one of the symbols having the value of 0 and the particular one of the symbols has the value of 0 at the observation number n, or if the probability $P_n$ indicates the probability of the particular one of the symbols having the value of 1 and the particular one of the symbols has the value of 1 at the observation number n, then $p_n = p_{n-1} - (p_{n-1} - (2^b - \delta)) >> m$; and if the probability $P_n$ indicates the probability of the particular one of the symbols having the value of 0 and the particular one of the symbols has the value of 1 at the observation number n, or if the probability $P_n$ indicates the probability of the particular one of the symbols having the value of 1 and the particular one of the symbols has the value of 0 at the observation number n, then $p_n = p_{n-1} - (p_{n-1} - \delta) >> m$, wherein m represents a memory rate relating to the explicit update function, b represents a number of bits used in the integer arithmetic to represent the probability $P_n$, and $\delta$ represents an offset of asymptotic limits of an exponential function used to update the probability $P_n$.

Also, another advantage/feature is the apparatus having the encoder as described above, wherein the explicit update function is selected from among a plurality of available explicit update functions based on a syntax element being currently encoded for the portion of the picture.

Additionally, another advantage/feature is the apparatus having the encoder as described above, wherein the explicit update function is an exponential function by parts.

Moreover, another advantage/feature is the apparatus having the encoder wherein the explicit update function is an exponential function by parts as described above, wherein parameters of the explicit update function are tuned to obtain different adaptation rates and probability value limits.

Further, another advantage/feature is the apparatus having the encoder wherein parameters of the explicit update function are tuned to obtain different adaptation rates and probability value limits as described above, wherein the parameters are dependent upon a syntax element being currently encoded for the portion of the picture.

These and other features and advantages of the present principles may be readily ascertained by one of ordinary skill in the pertinent art based on the teachings herein. It is to be understood that the teachings of the present principles may be implemented in various forms of hardware, software, firmware, special purpose processors, or combinations thereof.

Most preferably, the teachings of the present principles are implemented as a combination of hardware and software. Moreover, the software may be implemented as an application program tangibly embodied on a program storage unit. The application program may be uploaded to, and executed by, a machine comprising any suitable architecture. Preferably, the machine is implemented on a computer platform having hardware such as one or more central processing units ("CPU"), a random access memory ("RAM"), and input/output ("I/O") interfaces. The computer platform may also include an operating system and microinstruction code. The various processes and functions described herein may be either part of the microinstruction code or part of the application program, or any combination thereof, which may be executed by a CPU. In addition, various other peripheral units may be connected to the computer platform such as an additional data storage unit and a printing unit.

It is to be further understood that, because some of the constituent system components and methods depicted in the accompanying drawings are preferably implemented in software, the actual connections between the system components or the process function blocks may differ depending upon the manner in which the present principles are programmed. Given the teachings herein, one of ordinary skill in the pertinent art will be able to contemplate these and similar implementations or configurations of the present principles.

Although the illustrative embodiments have been described herein with reference to the accompanying drawings, it is to be understood that the present principles is not limited to those precise embodiments, and that various changes and modifications may be effected therein by one of ordinary skill in the pertinent art without departing from the scope or spirit of the present principles. All such changes and modifications are intended to be included within the scope of the present principles as set forth in the appended claims.

The invention claimed is:

1. An apparatus, comprising:
a video encoder having an entropy encoder for encoding symbols for picture data for at least a portion of a picture, wherein an explicit update function is used to update probabilities of the symbols processed by the entropy encoder, the explicit update function at least one of being truncated at a threshold value and having a varying rate of adaptation, and
wherein the explicit update function comprises exponential functions by part and wherein an update function memory parameter and threshold parameter vary by part to determine function thresholds and update rate.

2. The apparatus of claim 1, wherein the explicit update function is truncated with respect to probability values at least one of greater than an upper threshold limit and less than a lower threshold limit.

3. The apparatus of claim 1, wherein the explicit update function is a linear by parts function with thresholds.

4. The apparatus of claim 1, wherein the explicit update function is an exponential function with thresholds.

5. The apparatus of claim 1, wherein the explicit update function is an exponential function with asymptotic limits different from at least one of an upper probability limit value and a lower probability limit value.

6. The apparatus of claim 5, wherein the explicit update function uses integer arithmetic.

7. In a video encoder having an entropy encoder, a method, comprising:
encoding symbols for picture data for at least a portion of a picture, wherein an explicit update function is used to update probabilities of the symbols processed by the entropy encoder, the explicit update function at least one of being truncated at a threshold value and having a varying rate of adaptation, and
wherein the explicit update function comprises exponential functions by part and wherein an update function memory parameter and threshold parameter vary by part to determine function thresholds and update rate.

8. The method of claim 7, wherein the explicit update function is truncated with respect to probability values at least one of greater than an upper threshold limit and less than a lower threshold limit.

9. The method of claim 7, wherein the explicit update function is a linear by parts function with thresholds.

10. The method of claim 7, wherein the explicit update function is an exponential function with thresholds.

11. The method of claim 7, wherein the explicit update function is an exponential function with asymptotic limits different from at least one of an upper probability limit value and a lower probability limit value.

12. The method of claim 11, wherein the explicit update function uses integer arithmetic.

13. The method of claim 7, wherein the explicit update function is selected from among a plurality of available explicit update functions based on a syntax element being currently encoded for the portion of the picture.

14. The method of claim 7, wherein the explicit update function is an exponential function by parts.

15. The method of claim 14, wherein parameters of the explicit update function are tuned to obtain different adaptation rates and probability value limits.

16. The method of claim 15, wherein the parameters are dependent upon a syntax element being currently encoded for the portion of the picture.

17. In a video encoder having an entropy encoder, a method, comprising:
encoding symbols for picture data for at least a portion of a picture, wherein an explicit update function is used to update probabilities of the symbols processed by the entropy encoder, the explicit update function at least one of being truncated at a threshold value and having a varying rate of adaptation, wherein the explicit update function is an exponential function with asymptotic limits different from at least one of an upper probability limit value and a lower probability limit value, wherein the explicit update function uses integer arithmetic, wherein the symbols are binary symbols, and $P_n$ is capable of indicating a probability of a particular one of the symbols having a value of 0 or a value of 1 at observation number n, and:
if the probability $P_n$ indicates the probability of the particular one of the symbols having the value of 0 and the particular one of the symbols has the value of 0 at the observation number n, or if the probability $P_n$ indicates the probability of the particular one of the symbols having the value of 1 and the particular one of the symbols has the value of 1 at the observation number n, then $p_n = p_{n-1} - (p_{n-1} - (2^b - \delta)) \gg m$; and
if the probability $P_n$ indicates the probability of the particular one of the symbols having the value of 0 and the particular one of the symbols has the value of 1 at the observation number n, or if the probability $P_n$ indicates the probability of the particular one of the symbols having the value of 1 and the particular one of the symbols has the value of 0 at the observation number n, then $P_n = p_{n-1} - (p_{n-1} - \delta) \gg m$,
wherein m represents a memory rate relating to the explicit update function, b represents a number of bits used in the integer arithmetic to represent the probability $P_n$, and $\delta$ represents an offset of asymptotic limits of an exponential function used to update the probability $P_n$.

18. An apparatus, comprising:
a video decoder having an entropy decoder for decoding symbols for picture data for at least a portion of a picture, wherein an explicit update function is used to update probabilities of the symbols processed by the entropy decoder, the explicit update function at least one of being truncated at a threshold value and having a varying rate of adaptation, and
wherein the explicit update function comprises exponential functions by part and wherein an update function memory parameter and threshold parameter vary by part to determine function thresholds and update rate.

19. The apparatus of claim 18, wherein the explicit update function is truncated with respect to probability values at least one of greater than an upper threshold limit and less than a lower threshold limit.

20. The apparatus of claim 18, wherein the explicit update function is a linear by parts function with thresholds.

21. The apparatus of claim 18, wherein the explicit update function is an exponential function with thresholds.

22. The apparatus of claim 18, wherein the explicit update function is an exponential function with asymptotic limits different from at least one of an upper probability limit value and a lower probability limit value.

23. The apparatus of claim 22, wherein the explicit update function uses integer arithmetic.

24. In a video decoder having an entropy decoder, a method, comprising:
decoding symbols for picture data for at least a portion of a picture, wherein an explicit update function is used to update probabilities of the symbols processed by the entropy decoder, the explicit update function at least one of being truncated at a threshold value and having a varying rate of adaptation, and wherein the explicit update function comprises exponential functions by part and wherein an update function memory parameter and threshold parameter vary by part to determine function thresholds and update rate.

25. The method of claim 24, wherein the explicit update function is truncated with respect to probability values at least one of greater than an upper threshold limit and less than a lower threshold limit.

26. The method of claim 24, wherein the explicit update function is a linear by parts function with thresholds.

27. The method of claim 24, wherein the explicit update function is an exponential function with thresholds.

28. The method of claim 24, wherein the explicit update function is an exponential function with asymptotic limits different from at least one of an upper probability limit value and a lower probability limit value.

29. The method of claim 28, wherein the explicit update function uses integer arithmetic.

30. The method of claim 24, wherein the explicit update function is selected from among a plurality of available explicit update functions based on a value of a particular one of the symbols being currently decoded.

31. The method of claim 24, wherein the explicit update function is an exponential function by parts.

32. The method of claim 31, wherein parameters of the explicit update function are tuned to obtain different adaptation rates and probability value limits.

33. The apparatus of claim 32, wherein the parameters are dependent upon a value of a particular one of the symbols being currently decoded.

34. In a video decoder having an entropy decoder, a method, comprising:

decoding symbols for picture data for at least a portion of a picture, wherein an explicit update function is used to update probabilities of the symbols processed by the entropy decoder, the explicit update function at least one of being truncated at a threshold value and having a varying rate of adaptation, wherein the explicit update function is an exponential function with asymptotic limits different from at least one of an upper probability limit value and a lower probability limit value, wherein the explicit update function uses integer arithmetic, wherein the symbols are binary symbols, and $P_n$ is capable of indicating a probability of a particular one of the symbols having a value of 0 or a value of 1 at observation number n, and:

if the probability $P_n$ indicates the probability of the particular one of the symbols having the value of 0 and the particular one of the symbols has the value of 0 at the observation number n, or if the probability $P_n$ indicates the probability of the particular one of the symbols having the value of 1 and the particular one of the symbols has the value of 1 at the observation number n, then $p_n = p_{n-1} - (p_{n-1} - (2^b - \delta)) \gg m$; and if the probability $P_n$ indicates the probability of the particular one of the symbols having the value of 0 and the particular one of the symbols has the value of 1 at the observation number n, or if the probability $P_n$ indicates the probability of the particular one of the symbols having the value of 1 and the particular one of the symbols has the value of 0 at the observation number n, then $p_n = p_{n-1} - (p_{n-1} - \delta) \gg m$, wherein m represents a memory rate relating to the explicit update function, b represents a number of bits used in the integer arithmetic to represent the probability $P_n$, and $\delta$ represents an offset of asymptotic limits of an exponential function used to update the probability $P_n$.

35. A non-transitory computer readable medium having instructions stored thereon, which when executed, cause a processor to execute the steps of claim 34.

* * * * *